United States Patent
Ozeki et al.

(10) Patent No.: US 10,903,243 B2
(45) Date of Patent: Jan. 26, 2021

(54) DISPLAY DEVICE

(71) Applicant: Japan Display Inc., Minato-ku (JP)

(72) Inventors: Yoshitaka Ozeki, Tokyo (JP); Nobutaka Ozaki, Tokyo (JP); Koshiro Moriguchi, Tokyo (JP); Takahiro Takeuchi, Tokyo (JP); Koji Ishizaki, Tokyo (JP)

(73) Assignee: Japan Display Inc., Minato-ku (JP)

( * ) Notice: Subject to any disclaimer, the term of this patent is extended or adjusted under 35 U.S.C. 154(b) by 204 days.

(21) Appl. No.: 16/124,510

(22) Filed: Sep. 7, 2018

(65) Prior Publication Data

US 2019/0081085 A1    Mar. 14, 2019

(30) Foreign Application Priority Data

Sep. 8, 2017 (JP) ................................ 2017-173354
Sep. 13, 2017 (JP) ................................ 2017-176074

(51) Int. Cl.
*G02B 26/00* (2006.01)
*H01L 27/12* (2006.01)
(Continued)

(52) U.S. Cl.
CPC ........ *H01L 27/1237* (2013.01); *G02F 1/1368* (2013.01); *G02F 1/13454* (2013.01); *G02F 1/133345* (2013.01); *G02F 1/167* (2013.01); *G02F 1/16766* (2019.01); *H01L 27/3262* (2013.01); *G02F 1/1339* (2013.01); *G02F 1/136227* (2013.01); *G02F 1/1676* (2019.01); *G02F 1/1681* (2019.01); *G02F 1/16756* (2019.01); *G02F 1/16757* (2019.01); *G02F 2001/13685* (2013.01); *G02F 2001/1678* (2013.01); *G02F 2201/121* (2013.01); *G02F 2201/123* (2013.01); *G09G 3/3225* (2013.01);
(Continued)

(58) Field of Classification Search
CPC ............ H01L 27/1237; H01L 27/3262; G02F 1/16766; G02F 1/133345; G02F 1/13454; G02F 1/1368; G02F 1/167; G02F 1/16756; G02F 1/16757; G02F 1/1676; G02F 1/1681; G02F 1/1339; G02F 1/136227; G02F 2001/13685; G02F 2001/1678; G02F 2201/121; G02F 2201/123; G09G 3/3225; G09G 3/344; G09G 3/3648; G09G 2310/0267; G09G 2310/0275
USPC .......................... 359/296; 345/107; 204/600
See application file for complete search history.

(56) References Cited

U.S. PATENT DOCUMENTS

2017/0293186 A1* 10/2017 Kim ...................... H01L 27/124

FOREIGN PATENT DOCUMENTS

JP    2011-221097    11/2011
JP    2013-110291     6/2013

* cited by examiner

*Primary Examiner* — Wiliam Choi
(74) *Attorney, Agent, or Firm* — Oblon, McClelland, Maier & Neustadt, L.L.P.

(57) ABSTRACT

According to one embodiment, there is provided a display device including a basement, a first switching element which is provided on the basement and includes a first semiconductor layer and a first gate electrode, a second switching element which is provided on the basement and includes a second semiconductor layer and a second gate electrode, and a pixel electrode which is electrically connected to the first switching element. A distance between the first semiconductor layer and the first gate electrode is greater than a distance between the second semiconductor layer and the second gate electrode.

18 Claims, 14 Drawing Sheets

(51) Int. Cl.
  *H01L 27/32* (2006.01)
  *G02F 1/1368* (2006.01)
  *G02F 1/1333* (2006.01)
  *G02F 1/167* (2019.01)
  *G02F 1/16766* (2019.01)
  *G02F 1/1345* (2006.01)
  G02F 1/1675 (2019.01)
  G09G 3/36 (2006.01)
  G09G 3/3225 (2016.01)
  G02F 1/1339 (2006.01)
  G09G 3/34 (2006.01)
  G02F 1/1676 (2019.01)
  G02F 1/1681 (2019.01)
  G02F 1/16757 (2019.01)
  G02F 1/16756 (2019.01)
  G02F 1/1362 (2006.01)

(52) U.S. Cl.
  CPC ........... *G09G 3/344* (2013.01); *G09G 3/3648* (2013.01); *G09G 2310/0267* (2013.01); *G09G 2310/0275* (2013.01)

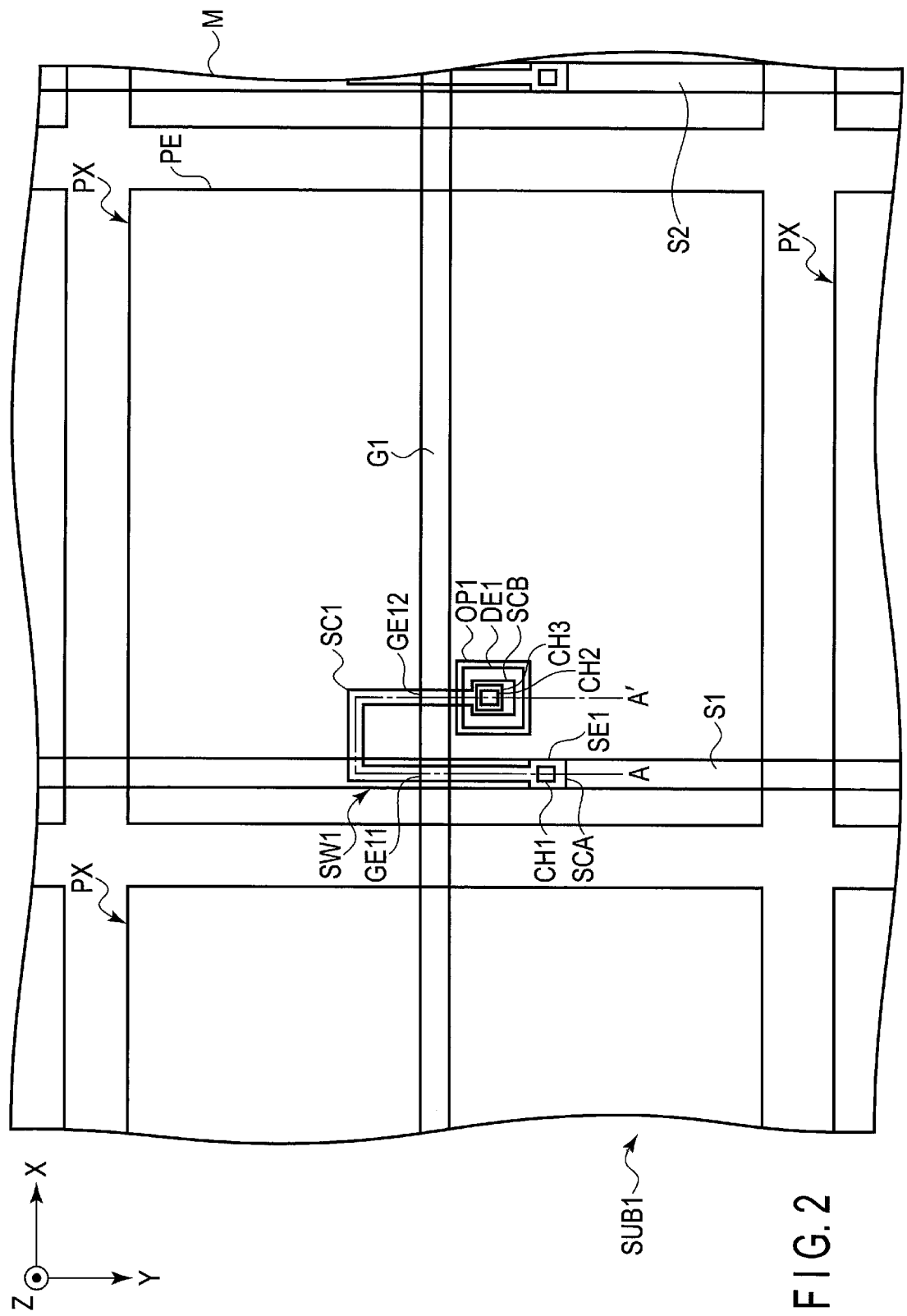
F I G. 2

DISPLAY DEVICE

CROSS-REFERENCE TO RELATED APPLICATIONS

This application is based upon and claims the benefit of priority from Japanese Patent Applications No. 2017-173354, filed Sep. 8, 2017; and No. 2017-176074, filed Sep. 13, 2017, the entire contents of all of which are incorporated herein by reference.

FIELD

Embodiments described herein relate generally to a display device.

BACKGROUND

An electrophoretic display device in which an electrophoretic element having an array of microcapsules is held between an element substrate and a counter-substrate is disclosed. Since the electrophoretic display device has storage properties, it is unnecessary to apply voltage constantly to maintain a display state. Meanwhile, at the time of switching display, for example, the drive voltage of a switching element included in a pixel is higher than the drive voltage of a switching element included in a peripheral circuit, for example.

BRIEF DESCRIPTION OF THE DRAWINGS

FIG. 2 is a plan view of a pixel of the display device shown in FIG. 1.

DETAILED DESCRIPTION

Figure 1:
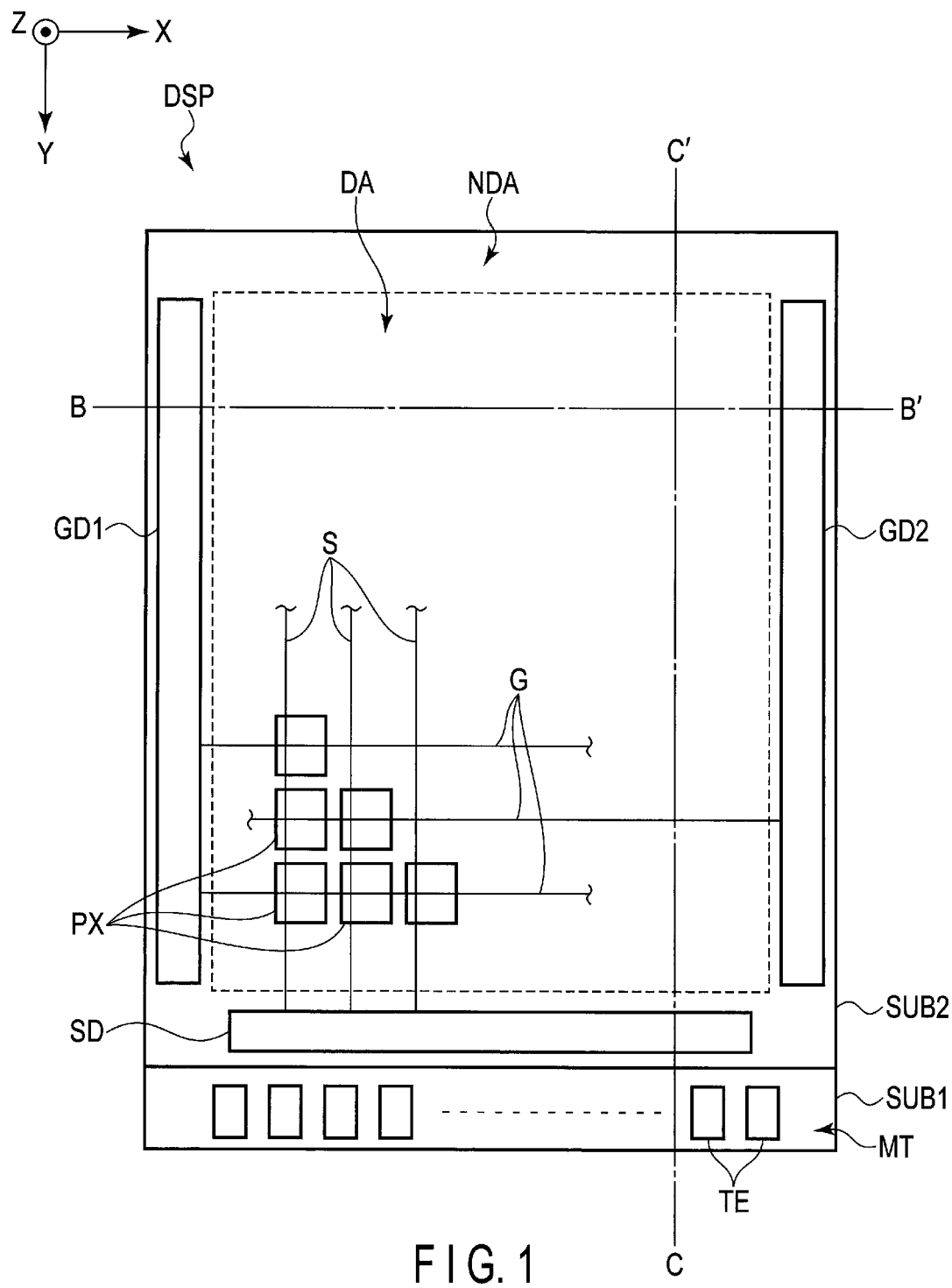
FIG. 1 is a plan view showing an example of the structure of a display device according to the first embodiment.

In general, according to one embodiment, there is provided a display device including a basement, a first switching element which is provided on the basement and includes a first semiconductor layer and a first gate electrode, a second switching element which is provided on the basement and includes a second semiconductor layer and a second gate electrode, and a pixel electrode which is electrically connected to the first switching element, wherein a distance between the first semiconductor layer and the first gate electrode is greater than a distance between the second semiconductor layer and the second gate electrode.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless otherwise necessary.

First Embodiment

FIG. 1 is a plan view showing an example of the structure of a display device DSP according to the first embodiment. In the drawing, a first direction X and a second direction Y intersect each other, and a third direction Z intersects the first direction X and the second direction Y. The first direction X, the second direction Y and the third direction Z orthogonally intersect each other, for example, but may intersect each other at an angle other than 90 degrees. In the present specification, the direction of the pointing end of an arrow indicating the third direction Z is referred to as upward (or simply above), and the direction opposite to the pointing end of the arrow is referred to as downward (or simply below). Further, assuming that a viewing position to view the display device DSP is located on the pointing end side of the arrow indicating the third direction Z, a view from this viewing position toward an X-Y plane defined by the first direction X and the second direction Y is defined as a planar view.

The display device DSP includes a first substrate SUB1 and a second substrate SUB2. In the example illustrated, the first substrate SUB1 has a mounting portion MT which extends beyond the second substrate SUB2 in the second direction Y. The mounting portion MT includes a plurality of terminals TE which connect the display device DSP to an external device.

The display device DSP includes a display area DA which displays an image, and a non-display area NDA. The display area DA is located in an area in which the first substrate SUB1 and the second substrate SUB2 overlap each other, and includes a plurality of pixels PX. In the example illustrated, the pixels PX are arranged in a matrix in the first direction X and the second direction Y. The non-display area NDA surrounds the display area DA.

The display device DSP includes a plurality of scanning lines G and a plurality of signal lines S in the display area DA. In the example illustrated, the scanning lines G extend in the first direction X and are arranged at intervals in the second direction Y. The signal lines S extend in the second direction Y and are arranged at intervals in the first direction X. Further, the display device DSP includes gate drivers GD1 and GD2 and a source driver SD in the non-display area NDA. In the example illustrated, the gate drivers GD1 and GD2 are opposed to each other across the display area DA in the first direction X. The source driver SD is arranged between the display area DA and the mounting portion MT.

The signal line S is connected to the source driver SD. The scanning line G is connected to one of the gate drivers GD1 and GD2. In the example illustrated, the scanning line G connected to the gate driver GD1 and the scanning line G connected to the gate driver GD2 are alternately arranged.

FIG. 2 is a plan view showing the pixel PX of the display device DSP shown in FIG. 1. The drawing only shows the main elements of the pixel PX which are provided in the first substrate SUB1 shown in FIG. 1. The pixel PX includes a switching element SW1, a metal film M and a pixel electrode PE.

The switching element SW1 is a thin-film transistor, for example. The switching element SW1 includes gate electrodes GE11 and GE12, a semiconductor layer SC1, a source electrode SE1 and a drain electrode (relay electrode) DE1. The switching element SW1 has a double-gate structure in the example illustrated but may have a single-gate structure.

The semiconductor layer SC1 substantially has the shape of letter U in a planar view. One end SCA of the semiconductor layer SC1 is located directly below a signal line S1 and is electrically connected to the signal line S1 in a contact hole CH1. Further, the other end SCB of the semiconductor layer SC1 is electrically connected to the drain electrode DE1 in a contact hole CH2. The semiconductor layer SC1 intersects a scanning line G1 twice between one end SCA and the other end SCB.

The gate electrodes GE11 and GE12 correspond to areas of the scanning line G1 which overlap the semiconductor layer SC1. In the example illustrated, the scanning line G1 extends in the first direction X and passes through the center of the pixel PX. The source electrode SE1 includes an area of the signal line S1 which contacts the semiconductor layer SC1. In the example illustrated, the signal line S1 extends in the second direction Y and is located at the left edge of the pixel PX. The drain electrode DE1 has the shape of an island and overlaps the pixel electrode PE between the signal lines S1 and S2.

The metal film M overlaps the pixels PX arranged in the first direction X and the second direction Y and also overlaps both the scanning line G1 and the signal line S1. In each pixel PX, the metal film M has an opening OP1 at a position overlapping the drain electrode DE1. The metal film M is formed at least across substantially the entire display area DA shown in FIG. 1. For example, a common potential is supplied to the metal film M in the non-display area NDA.

In the pixel PX, the pixel electrode PE overlaps the metal film M, the switching element SW1, the scanning line G1 and the signal line S1. The pixel electrode PE is electrically connected to the drain electrode DE1 via the opening OP1 and a contact hole CH3. As the drain electrode DE1 functions as a relay electrode, the pixel electrode PE and the switching element SW1 are electrically connected to each other. The pixel electrode PE has the shape of a square having the same length in the first direction X and the second direction Y in the example illustrated but is not limited to this example. The pixel electrode PE may have the shape of a rectangle elongated in the first direction X or the second direction Y or may have the shape of another polygon.

A portion in which the pixel electrode PE and the metal film M overlap each other in a planar view corresponds to storage capacitance of each pixel PX. In the example illustrated, since the metal film M is formed across substantially the entire pixel PX, substantially the entire area in which the pixel electrode PE is formed overlaps the metal film M and forms storage capacitance.

Figure 3:
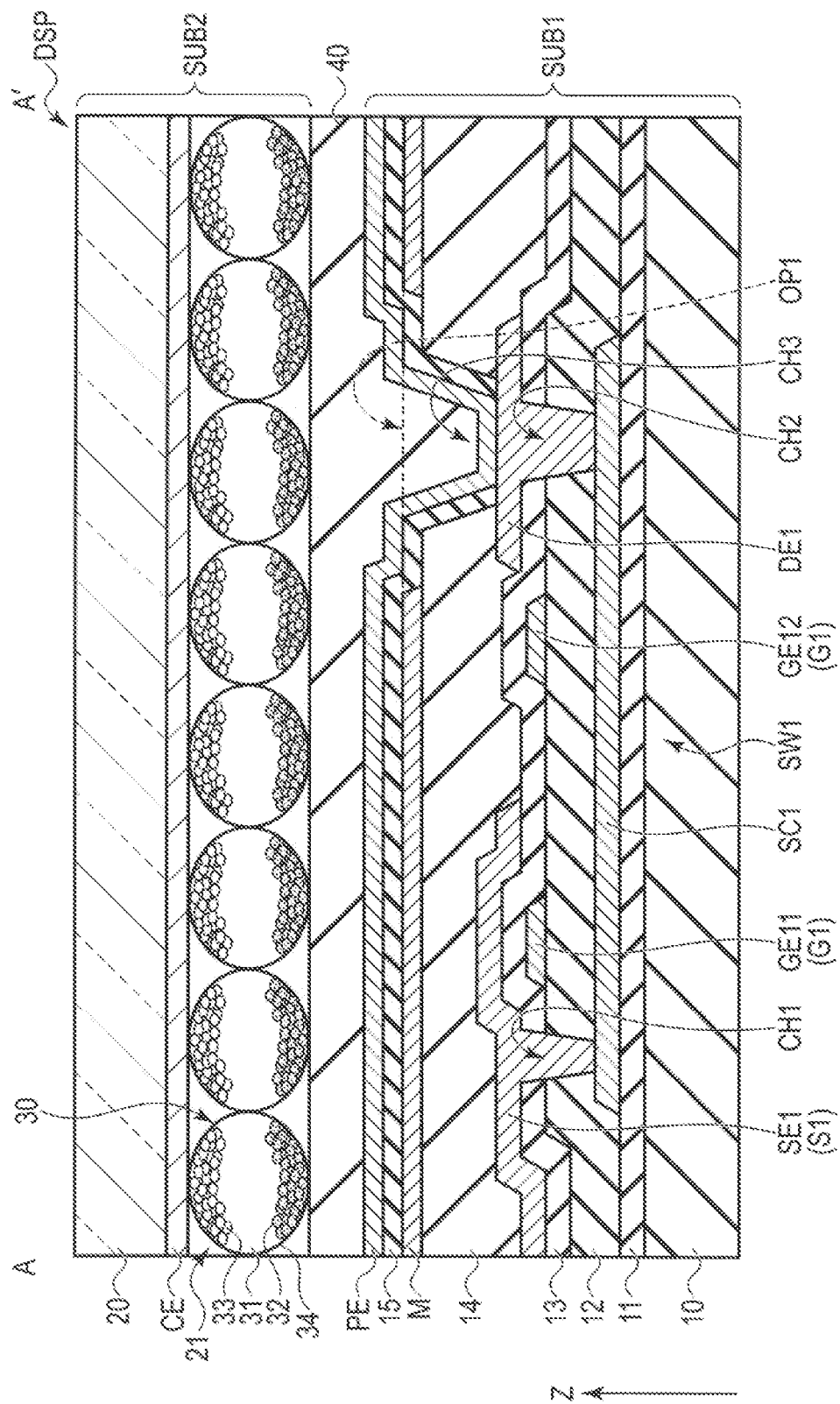
FIG. 3 is a sectional view of the pixel taken along line A-A' shown in FIG. 2.

FIG. 3 is a sectional view of the pixel PX taken along line A-A' shown in FIG. 2. The first substrate SUB1 and the second substrate SUB2 are attached together by an adhesive layer 40. In the illustrated cross-section, the viewing position of the display device DSP is assumed to be located above the second substrate SUB2.

The first substrate SUB1 includes a basement 10, insulating films 11 to 15, the switching element SW1, the metal film M and the pixel electrode PE. The switching element SW1 is a top-gate type, for example.

The basement 10 is formed of insulating glass, resin, etc. Since the basement 10 is located on the opposite side to the viewing position, the basement 10 may be non-transparent. The insulating film 11 is located on the basement 10. The semiconductor layer SC1 is located on the insulating film 11 and is covered with the insulating film 12. The semiconductor layer SC1 is formed of polycrystalline silicon, for example, but may be formed of amorphous silicon or an oxide semiconductor. The gate electrodes GE11 and GE12 which are integrated with the scanning line G1 are located on the insulating film 12 and are covered with the insulating film 13. The scanning line G1 and the gate electrodes GE11 and GE12 are formed of a metal material such as aluminum (Al), titanium (Ti), silver (Ag), molybdenum (Mo), tungsten (W), copper (Cu) and chromium (Cr) or an alloy of these metal materials, and may have a single layer structure or a multilayer structure.

The source electrode SE1 which is integrated with the signal line S1, and the drain electrode DE1 are located on the insulating film 13 and are covered with the insulating film 14. The signal line S1, the source electrode SE1 and the drain electrode DE1 are formed of the same material and are formed of, for example, the above-described metal material. The source electrode SE1 contacts the semiconductor layer SC1 via the contact hole CH1 which penetrates the insulating films 13 and 12. The drain electrode DE1 contacts the semiconductor layer SC1 via the contact hole CH2 which penetrates the insulating films 13 and 12.

The metal film M is located on the insulating film 14 and is covered with the insulating film 15. The metal film M functions as a reflective film which reflects light entering from the second substrate SUB2 side, and also functions as a light-shielding film which prevents radiation of light to the switching element SW1. The metal film M has the opening OP1 located directly above the drain electrode DE1. The metal film M is formed of, for example, a metal material such as aluminum. More specifically, the metal film M has a multilayer structure of aluminum and titanium, a multilayer structure of aluminum and molybdenum, etc.

The pixel electrode PE is located on the insulating film 15. The pixel electrode PE is formed of, for example, a transparent conductive material of indium tin oxide (ITO) or indium zinc oxide (IZO). The pixel electrode PE is opposed to the metal film M via the insulating film 15. The pixel electrode PE contacts the drain electrode DE1 via the contact hole CH3 which penetrates the insulating film 15 and the insulating film 14 at a position overlapping the opening OP1.

In the present embodiment, all the insulating films 11 to 13 and the insulating film 15 are formed of an inorganic insulating material such as silicon oxide, silicon nitride or silicon oxynitride. On the other hand, the insulating film 14 is formed of an organic insulating material. These insulating films 11 to 15 may have a single layer structure or a multilayer structure. The insulating film 15 corresponds to a capacitance insulating film interposed between the metal film M and the pixel electrode PE.

The second substrate SUB2 includes a basement 20, a common electrode CE and an electrophoretic element 21. The basement 20 is formed of insulating glass or resin. Since the basement 20 is located on the viewing position side, the basement 20 is transparent. The common electrode CE is located between the basement 20 and the electrophoretic element 21. The common electrode CE is a transparent electrode formed of a transparent conductive material such as ITO or IZO. The common electrode CE is formed across substantially the entire display area DA shown in FIG. 1. For example, a common potential is supplied to the common electrode CE in the non-display area NDA. The electrophoretic element 21 is formed of a plurality of microcapsules 30 which are tightly arranged with hardly any spaces left therebetween.

The adhesive layer 40 is located between the pixel electrode PE and the electrophoretic element 21.

The microcapsule 30 is a sphere having a particle diameter of 50 to 100 μm, for example. In the example illustrated, a large number of microcapsules 30 are arranged between one pixel electrode PE and the common electrode CE under the constraints of scale, but about one to ten microcapsules 30 are arranged in the pixel PX having the shape of a square of about several hundreds of micrometers on a side.

The microcapsule 30 includes a dispersion medium 31, a plurality of black particles 32 and a plurality of white particles 33. The black particle 32 and the white particle 33 may also be referred to as electrophoretic particles. An outer shell (wall film) 34 of the microcapsule 30 is formed of, for example, transparent resin such as acrylic resin. The dispersion medium 31 is a fluid which disperses the black particles 32 and the white particles 33 in the microcapsule 30. The black particle 32 is, for example, a particle (polymer or colloid) of a black pigment such as aniline black and is, for example, positively charged. The white particle 33 is, for example, a particle (polymer or colloid) of a white pigment such as titanium dioxide and is, for example, negatively charged. Dopant may be added to these pigments when needed. Further, for example, pigments of red, green, blue, yellow, cyan, magenta, etc., may be used in place of the black particle 32 and the white particle 33.

In the electrophoretic element 21 structured as described above, in the case of black display of the pixel PX, the pixel electrode PE is maintained at a potential relatively higher than that of the common electrode CE. That is, assuming the potential of the common electrode CE as a reference potential, the polarity of the pixel electrode PE is maintained to be positive. Accordingly, the positively-charged black particle 32 is drawn to the common electrode CE, while the negatively-charged white particle 33 is drawn to the pixel electrode PE. As a result, black is visually recognized when this pixel PX is viewed from the common electrode CE side. On the other hand, in the case of white display of the pixel PX, assuming the potential of the common electrode CE as a reference potential, the polarity of the pixel electrode PE is maintained to be negative. Accordingly, the negatively-charged white particle 33 is drawn to the common electrode CE, while the positively-charged black particle 32 is drawn to the pixel electrode PE. As a result, white is visually recognized when this pixel PX is viewed.

Figure 4:
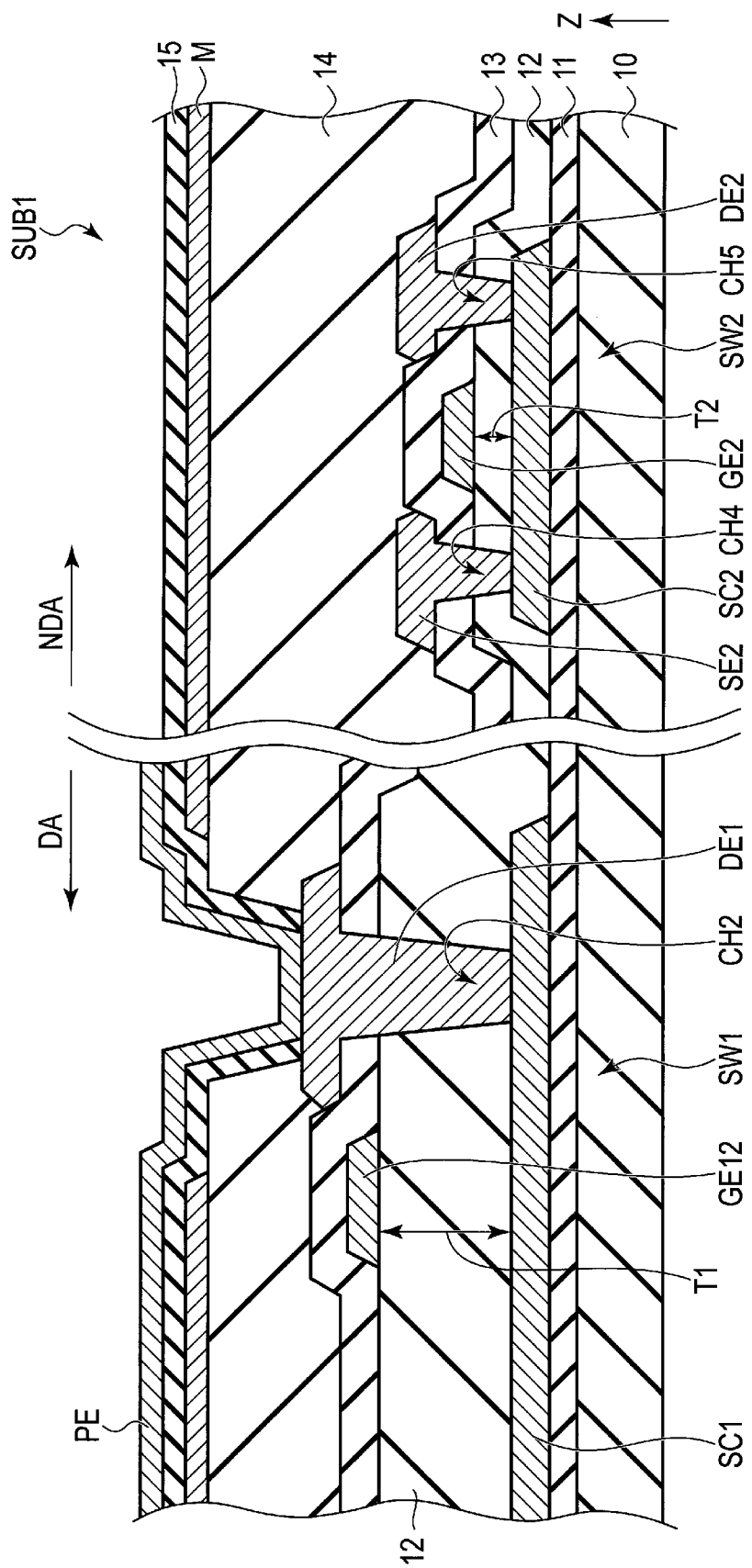
FIG. 4 is a sectional view of a first substrate in a display area and a non-display area.

FIG. 4 is a sectional view showing the first substrate SUB1 in the display area DA and the non-display area NDA. FIG. 4 shows part of the switching element SW1 arranged in the display area DA, and a switching element SW2 arranged in the non-display area NDA. The switching element SW1 have the same structure as that of the switching element SW1 shown in FIG. 3 and is electrically connected to the pixel electrode PE. The switching element SW2 is, for example, a switching element included in the source driver SD, the gate drivers GD1 and GD2, etc. In the example illustrated, the switching elements SW1 and SW2 are top-gate thin-film transistors.

The switching element SW2 has a single-gate structure in the example illustrated but may have a double-gate structure. The switching element SW2 has the same structure as that of the switching element SW1. That is, the switching element SW2 includes a semiconductor layer SC2, a gate electrode GE2, a source electrode SE2 and a drain electrode DE2. The semiconductor layer SC2 is located on the insulating film 11 and is covered with the insulating film 12. The gate electrode GE2 is located on the insulating film 12 and is covered with the insulating film 13. The source electrode SE2 and the drain electrode DE2 are located on the insulating film 13 and are covered with the insulating film 14. The source electrode SE2 and the drain electrode DE2 contact the semiconductor layer SC, respectively, via contact holes CH4 and CH5 which penetrate the insulating films 13 and 12.

For example, the metal film M provided in the first substrate SUB1 also extends in the non-display area NDA. Accordingly, radiation of light to the switching element SW2 located in the non-display area NDA can be prevented.

In the present embodiment, the distance between the semiconductor layer SC1 and the gate electrode GE12 is greater than the distance between the semiconductor layer SC2 and the gate electrode GE2. In the example illustrated, a thickness T1 of the insulating film 12 in the display area DA is greater than a thickness T2 of the insulating film 12 in the non-display area NDA. For example, the thickness T1 is greater than or equal to three times as thick as the thickness T2. More specifically, the thickness T2 is 50 to 100 nm, for example, and the thickness T1 is 200 to 300 nm, for example. Here, the thickness T1 corresponds to a dimension of the insulating film 12 which contacts the semiconductor layer SC1 in the third direction Z. Further, the thickness T2 corresponds to a dimension of the insulating film 12 which contacts the semiconductor layer SC2 in the third direction Z. In the example illustrated, the insulating film 12 has substantially the constant thickness T2 across the entire non-display area NDA and has substantially the constant thickness T1 across the entire display area DA. As will be described later, the insulating film 12 only has to be substantially thick at least directly below the gate electrodes GE12 and GE11.

Figure 5:
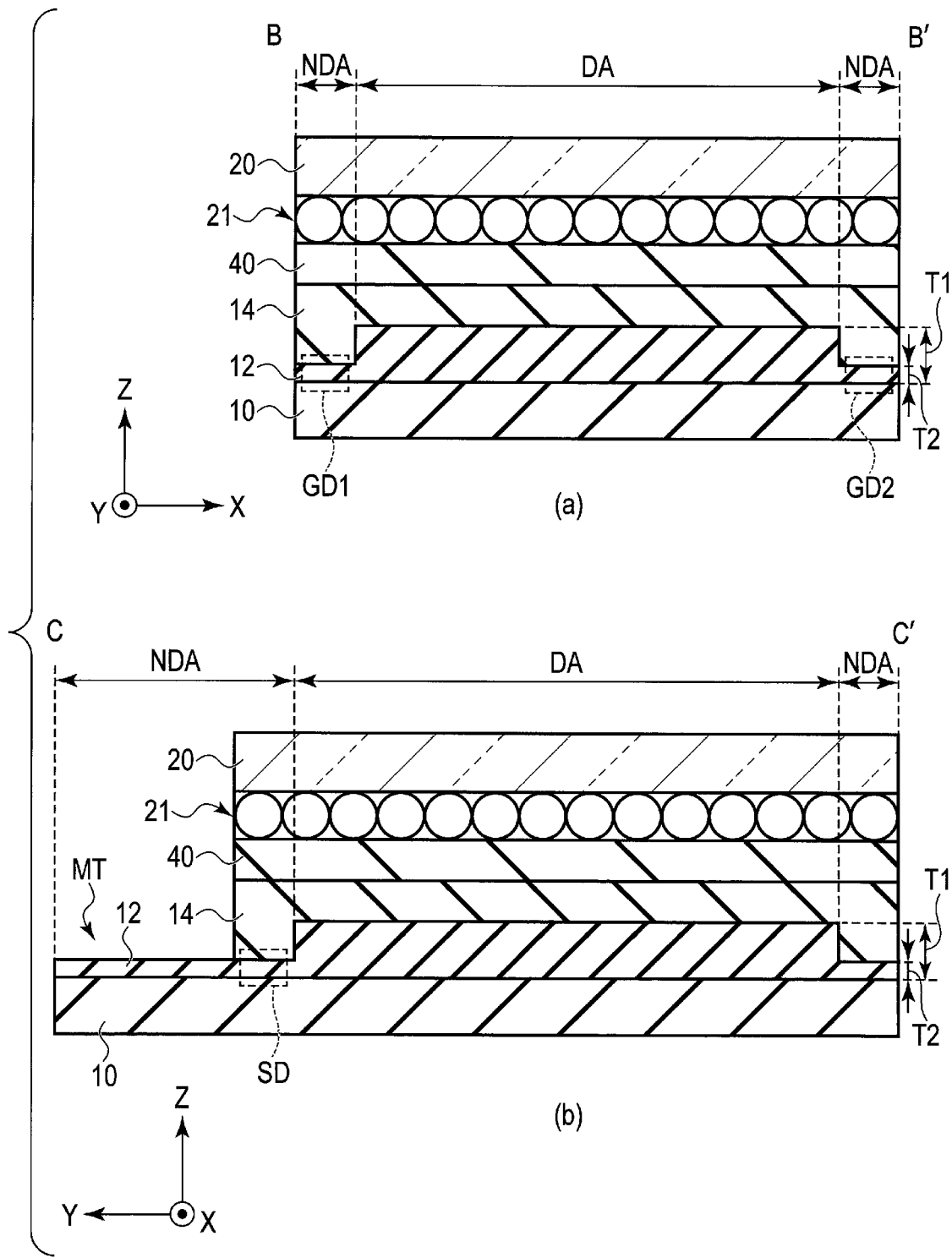
FIG. 5 is a schematic view of the entire display device.

FIG. 5 is a schematic view of the entire display device DSP. FIG. 5(a) is a sectional view taken along line B-B' of FIG. 1, and FIG. 5(b) is a sectional view taken along line C-C' of FIG. 1. Here, only the structures necessary for explanation are illustrated.

As shown in FIG. 5(a), the insulating film 12 has the thickness T2 in the non-display area NDA in which the gate drivers GD1 and GD2 are formed. Further, as shown in FIG. 5(b), the insulating film 12 has the thickness T2 in the non-display area NDA in which the source driver SD is formed. In the example illustrated, the insulating film 12 also has the thickness T2 in the mounting portion MT and on the opposite side to the mounting portion MT. In other words, an area in which the insulating film 12 has the thickness T2 has the shape of a ring. The insulating film 12 may have the thickness T1, that is, the same thickness as that of the display area DA on the opposite side to the mounting portion MT. This insulating film 12 can be formed by photolithography and wet etching, for example. In the example illustrated, unevenness of the insulating film 12 developed by the thicknesses T1 and T2 is smoothed by the insulating film 14 and the adhesive layer 40.

According to the present embodiment, the thickness T1 of the insulating film 12 in the display area DA is greater than the thickness T2 of the insulating film 12 in the non-display area NDA. That is, the gate insulating film of the switching element SW1 included in the pixel PX is greater than the gate insulating film of the switching element SW2 included in the peripheral circuit such as the source driver SD, for example. Therefore, in the pixel PX, even if the drive voltage of the switching element SW1 (that is, the voltage applied to the gate electrodes GE11 and GE12) is higher than the drive voltage of the switching element SW2 included in the peripheral circuit (that is, the voltage applied to the gate electrode GE2), dielectric breakdown of the insulating film 12 in the display area DA can be prevented. Consequently, a highly-reliable display device can be provided.

Figure 6:
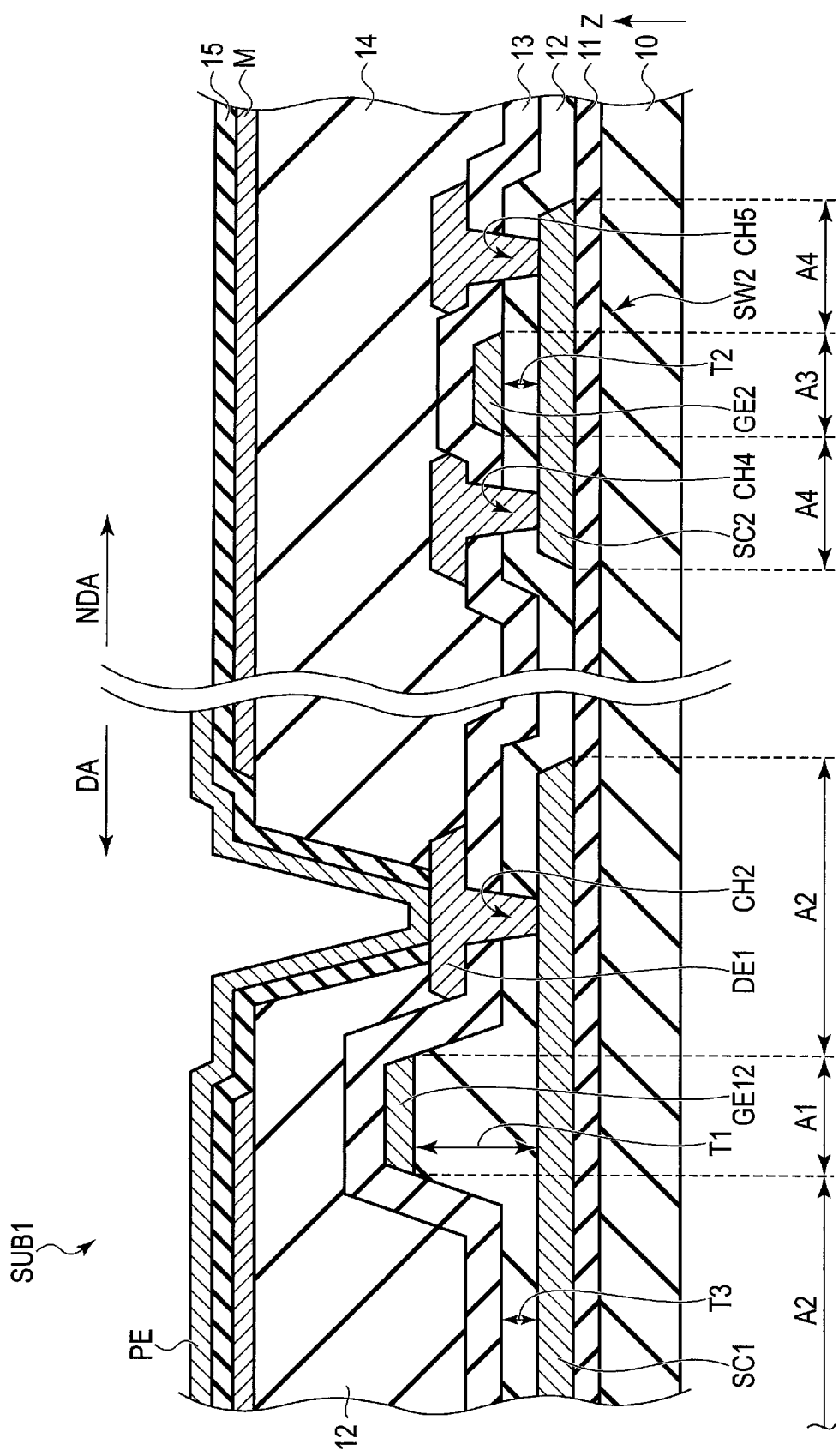
FIG. 6 is a schematic view showing another example of the first substrate.

FIG. 6 is a sectional view showing another example of the first substrate SUB1. The example shown in FIG. 6 differs from the example shown in FIG. 4 in that the insulating film 12 is thick directly below the gate electrode GE12 and is thin in the periphery of the gate electrode GE12.

That is, the thickness of the insulating film 12 contacting the semiconductor layer SC1 is not constant. The semiconductor layer SC1 has a first area A1 which overlaps the gate electrode GE12 and a second area A2 which does not overlap the gate electrode GE12. The insulating film 12 has the thickness T1 in the first area A1 and has a third thickness T3 which is less than the thickness T1 in the second area A2. The drain electrode DE1 as a relay electrode is located in the second area A2. The drain electrode DE1 contacts the semiconductor layer SC1 in the contact hole CH2 provided in the second area A2. On the other hand, the semiconductor layer SC2 has a third area A3 which overlaps the gate electrode GE2 and a fourth area A4 which does not overlap the gate electrode GE2. The insulating film 12 has the thickness T2 both in the third area A3 and the fourth area A4.

For example, the thickness T3 is equal to the thickness T2. Note that the thickness T3 may be different from the thickness T2. The drain electrode DE1 is provided within an area overlapping the second area A2. Therefore, the depth of the contact hole CH2 in the present example is less than that of the example shown in FIG. 4.

The same effect as that produced from the example shown in FIG. 4 can also be produced from the present example. Further, the thickness T3 of the insulating film 12 located directly below the drain electrode DE1 is substantially equal to the thickness T2. Therefore, even in the case of forming the contact holes CH4 and CH5 provided in the switching element SW2 concurrently with the contact hole CH2, overetching in the contact holes CH4 and CH5 can be prevented. Therefore, damage to the semiconductor layer SC2 can be reduced, and a highly-reliable display device can be provided.

Figure 7:
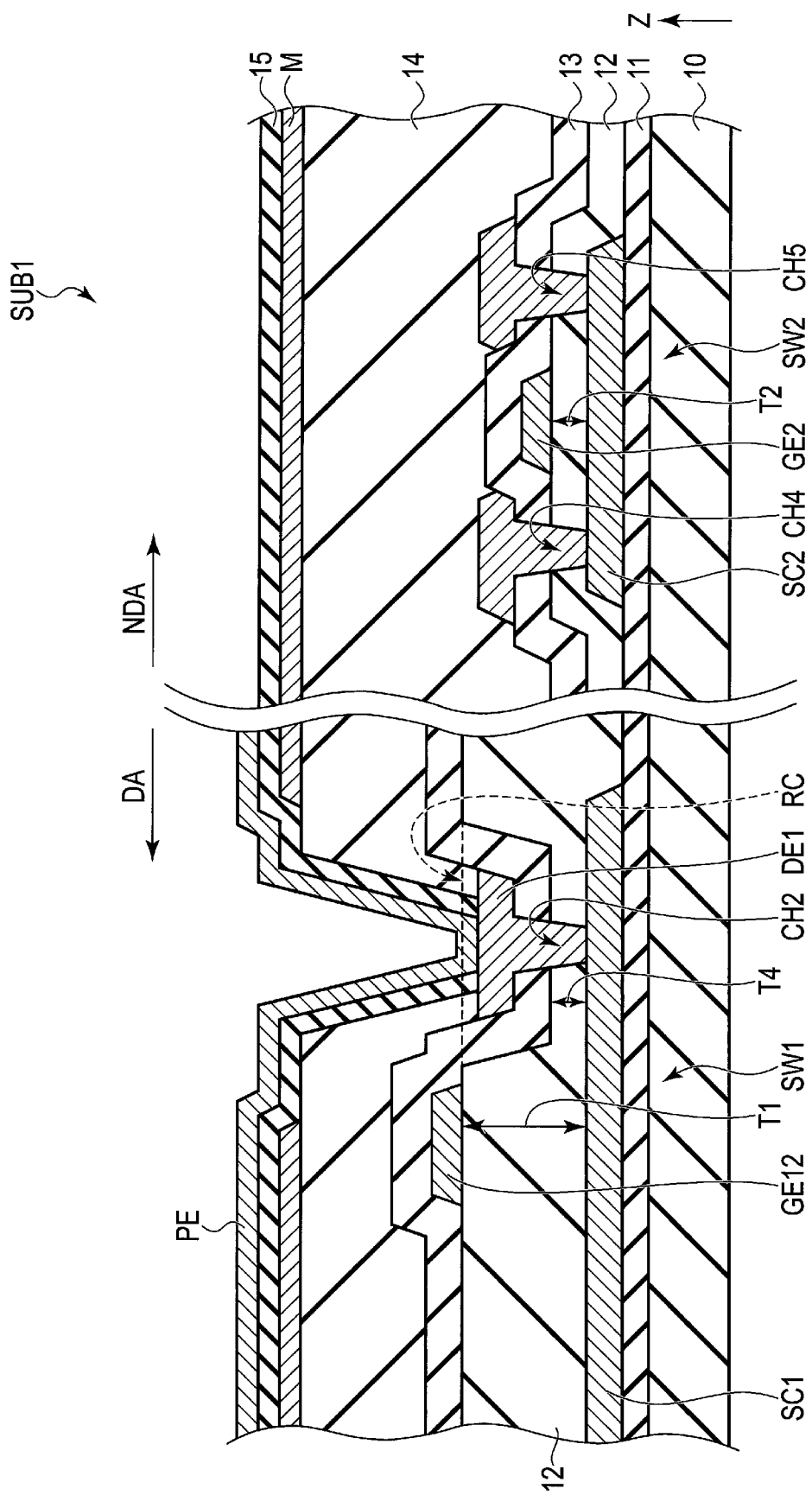
FIG. 7 is a sectional view showing another example of the first substrate.

FIG. 7 is a sectional view showing another example of the first substrate SUB1. The example shown in FIG. 7 differs from the example shown in FIG. 4 in that the insulating film 12 in the display area DA is reduced in thickness directly below the drain electrode DE1.

The insulating film 12 has a recess RC directly below the drain electrode DE1. Although not shown in the drawing, the insulating film 12 also has the same structure directly below the source electrode SE1. The drain electrode DE1 is provided in the recess RC. The drain electrode DE1 contacts the semiconductor layer SC1 via the contact hole CH2 which is provided in such a manner as to overlap the recess RC. A thickness T4 of the insulating film 12 in the recess is less than the thickness T1. For example, the thickness T4 is equal to the thickness T2. Note that the thickness T4 may be different from the thickness T2.

The same effect as that produced from the example shown in FIG. 4 can also be produced from the present example. Further, since the thickness T4 of the insulating film 12 located directly below the drain electrode DE1 is substantially equal to the thickness T2, the same effect as that produced from the example shown in FIG. 6 can also be produced from the present example.

Figure 8:
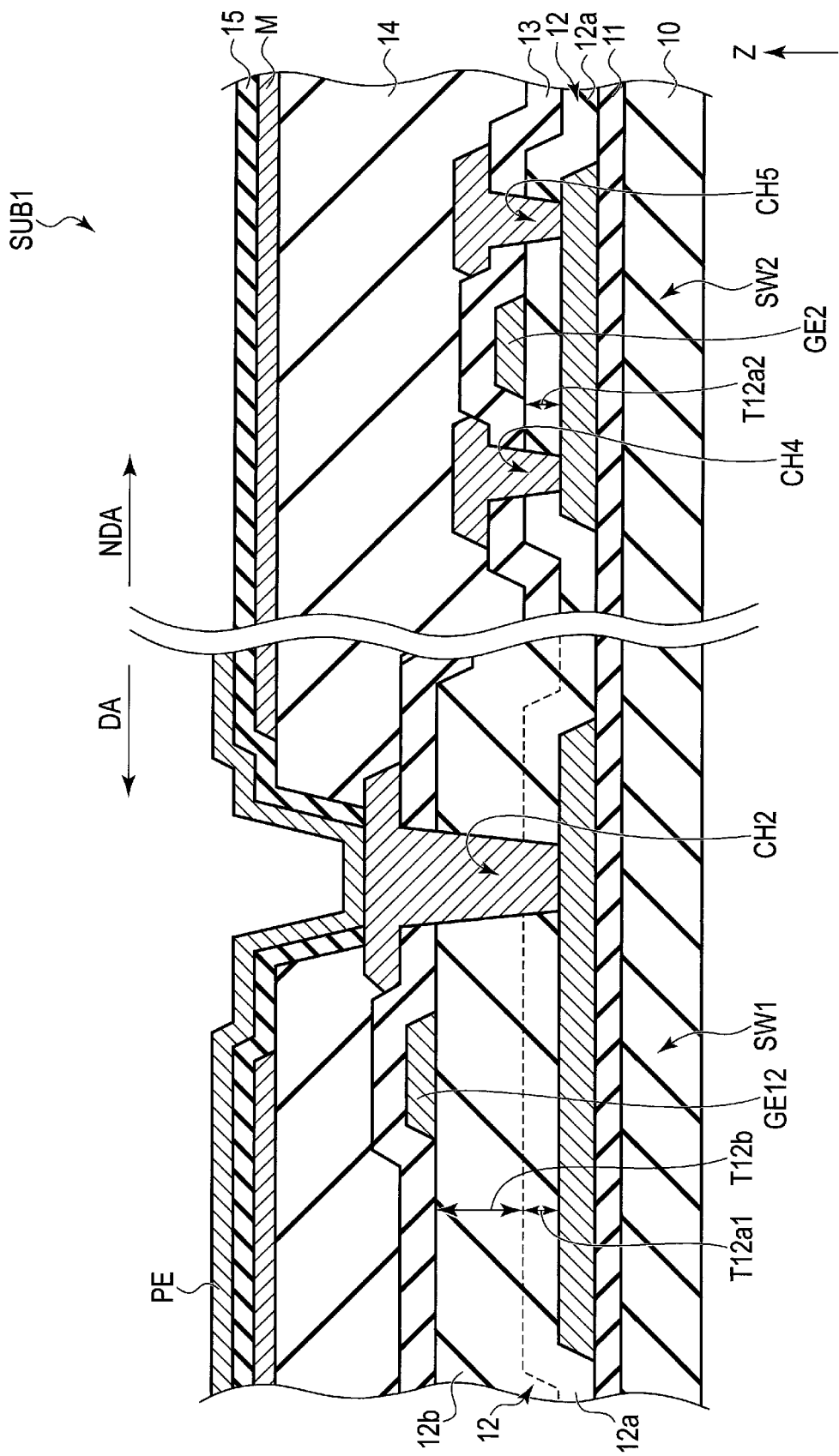
FIG. 8 is a sectional view showing another example of the first substrate.

FIG. 8 is a sectional view showing another example of the first substrate SUB1. The example shown in FIG. 8 differs from the example shown in FIG. 4 in that the insulating film 12 includes a silicon oxide layer 12a and a silicon nitride layer 12b.

In the example illustrated, the insulating film 12 includes the silicon oxide layer 12a and the silicon nitride layer 12b in the display area DA. On the other hand, the insulating film 12 hardly includes the silicon nitride layer 12b and is mostly formed of the silicon oxide layer 12a in the non-display area NDA. The silicon oxide layer 12a contacts the semiconductor layers SC1 and SC2. Further, in the example illustrated, the silicon oxide layer 12a also contacts the gate electrode GE2. The silicon nitride layer 12b is located on the silicon oxide layer 12a and contacts the gate electrode GE12.

An amount of hydrogen contained in the silicon oxide layer 12a is smaller than an amount of hydrogen contained in the silicon nitride layer 12b. Further, the etching rate of the silicon oxide layer 12a is lower than the etching rate of the silicon nitride layer 12b. In the example illustrated, a thickness T12b of the silicon nitride layer 12b is greater than a thickness T12a1 of the silicon oxide layer 12a in the display area DA. If the silicon oxide layer 12a contacts the gate electrode GE2, a thickness T12a2 of the silicon oxide layer 12a in the non-display area NDA is less than or equal to the thickness T12a1.

The same effect as that produced from the example shown in FIG. 4 can also be produced from the present example. Further, since the silicon oxide layer 12a having a low etching rate is arranged on a side of the insulating film 12 which contacts the semiconductor layers SC1 and SC2, even in the case of forming the contact holes CH4 and CH5 concurrently with the contact holes CH1 and CH2, overetching in the contact holes CH4 and CH5 can be prevented. Therefore, damage to the semiconductor layer SC2 can be reduced, and a highly-reliable display device can be provided.

Figure 9:
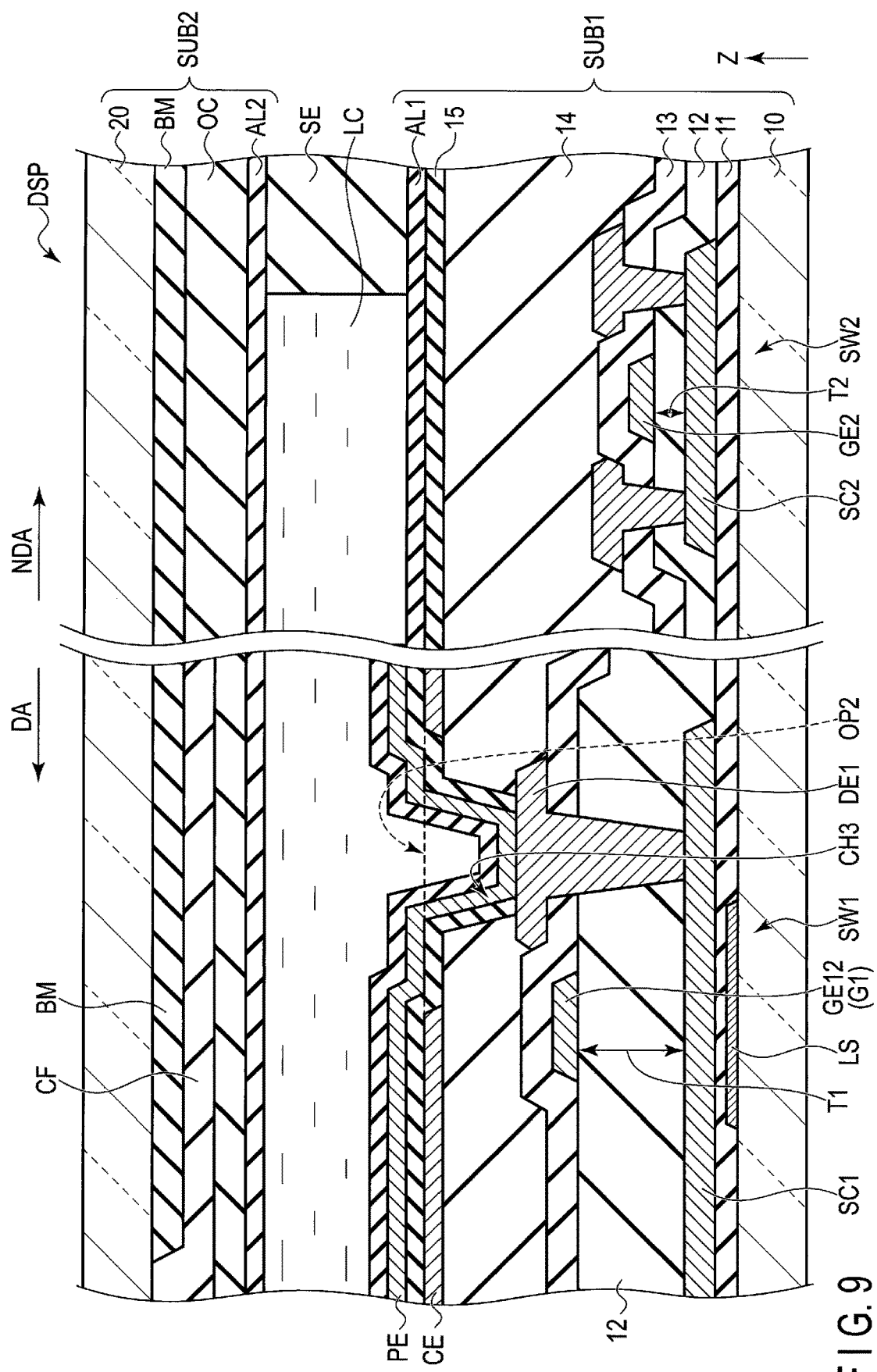
FIG. 9 is a sectional view showing another example of the display device.

FIG. 9 is a sectional view showing another example of the display device DSP. The example shown in FIG. 9 differs from the examples shown in FIGS. 3 and 4 in that the display device DSP is a liquid crystal display device including a liquid crystal layer LC. The first substrate SUB1 and the second substrate SUB2 are attached together by a sealant SE. The liquid crystal layer LC is held between the first substrate SUB1 and the second substrate SUB2.

For example, the display device DSP is a transmissive liquid crystal display device which has a transmissive display function of displaying an image by selectively transmitting light from below the first substrate SUB1 (from the opposite side to the display surface). The display device DSP may be a reflective liquid crystal display device which has a reflective display function of displaying an image by selectively reflecting light from above the second substrate SUB2 (from the display surface side) or may be a transflective liquid crystal display device which has the transmissive display function and the reflective display function.

The first substrate SUB1 includes a light-shielding layer LS, the common electrode CE and an alignment film AL1 in addition to the basement 10, the insulating films 11 to 15, the switching element SW1, the switching element SW2 and the pixel electrode PE.

The basement 10 is formed of insulating glass, resin, etc. In the present example, to transmit light from below, the basement 10 is transparent. The light-shielding layer LS prevents radiation of light from below to the switching element SW1. In the example illustrated, the light-shielding layer LS is located directly below the gate electrode GE12 between the insulating film 11 and the basement 10. The light-shielding layer LS is formed of, for example, a metal material such as aluminum. The gate electrode GE12 entirely overlaps the light-shielding layer LS. Although not shown in the drawing, the same light-shielding layer LS is also provided directly below the gate electrode GE11. The structure from the insulating film 11 to the insulating film 14 is the same as those of the examples shown in FIGS. 3 and 4, and therefore explanation thereof will be omitted.

The common electrode CE is located on the insulating film 14. In the example illustrated, the common electrode CE is provided substantially the entire display area DA and does not extend in the non-display area NDA. The common electrode CE has an opening OP2 located directly above the drain electrode DE1. The insulating film 15 covers the common electrode CE and is also provided on the insulating film 14. The pixel electrode PE is located on the insulating film 15. The pixel electrode PE contacts the drain electrode DE1 via the opening OP2 and the contact hole CH3. The alignment film AL1 covers the pixel electrode PE, and extends to the non-display area NDA and covers the insulating film 15. The insulating film 15 corresponds to a capacitance insulating film interposed between the common electrode CE and the pixel electrode PE.

The second substrate SUB2 includes a light-shielding layer BM, a color filter layer CF, an overcoat layer OC and an alignment film AL2 in addition to the basement 20.

The light-shielding layer BM and the color filter layer CF are located on a side of the basement 20 which is opposed to the first substrate SUB1. The light-shielding layer BM partitions the pixels PX in the display area DA and also extends in the non-display area NDA. In the example illustrated, the light-shielding layer BM overlaps the semiconductor layer SC1, the scanning line G1 and the contact hole CH3. The color filter layer CF is opposed to the pixel electrode PE and partially overlaps the light-shielding layer BM. The color filter layer CF includes a red color filter, a green color filter, a blue color filter, etc. The overcoat layer OC covers the color filter layer CF, and also covers the light-shielding layer BM in the non-display area NDA. The second alignment film AL2 covers the overcoat layer OC.

Note that the color filter layer CF may be arranged in the first substrate SUB1 instead. The color filter layer CF may include color filters of four or more colors. In the pixel which displays white, a white color filter or an uncolored resin material may be arranged, or the overcoat layer OC may be arranged without any color filter. Further, the light-shielding layer BM may be arranged between the overcoat layer OC and the color filter layer CF instead.

The display device DSP shown in FIG. 9 has a structure conforming to a display mode which mainly uses a lateral electric field substantially parallel to the surfaces of the substrates. In the display mode using the lateral electric field, for example, the display device DSP can adopt, for example, such a structure that both the pixel electrode PE and the common electrode CE are provided in one of the first substrate SUB1 and the second substrate SUB2. In the example illustrated, both the pixel electrode PE and the common electrode CE are provided in the first substrate SUB1. The display panel PNL may have a structure conforming to a display mode which uses a longitudinal electric field perpendicular to the surfaces of the substrates, a display mode which uses an oblique electric field inclined with respect to the surfaces of the substrates or a display mode which uses a combination thereof. In the display mode using the longitudinal electric field or the oblique electric field, for example, the display panel PNL can adopt, for example, such a structure that one of the pixel electrode PE and the common electrode CE is provided in the first substrate SUB1 and the other one of the pixel electrode PE and the common electrode CE is provided in the second substrate SUB2.

Since the thickness T1 is greater than the thickness T2 in the present example, the same effect as that produced from the example shown in FIG. 4 can also be produced from the present example.

Figure 10:
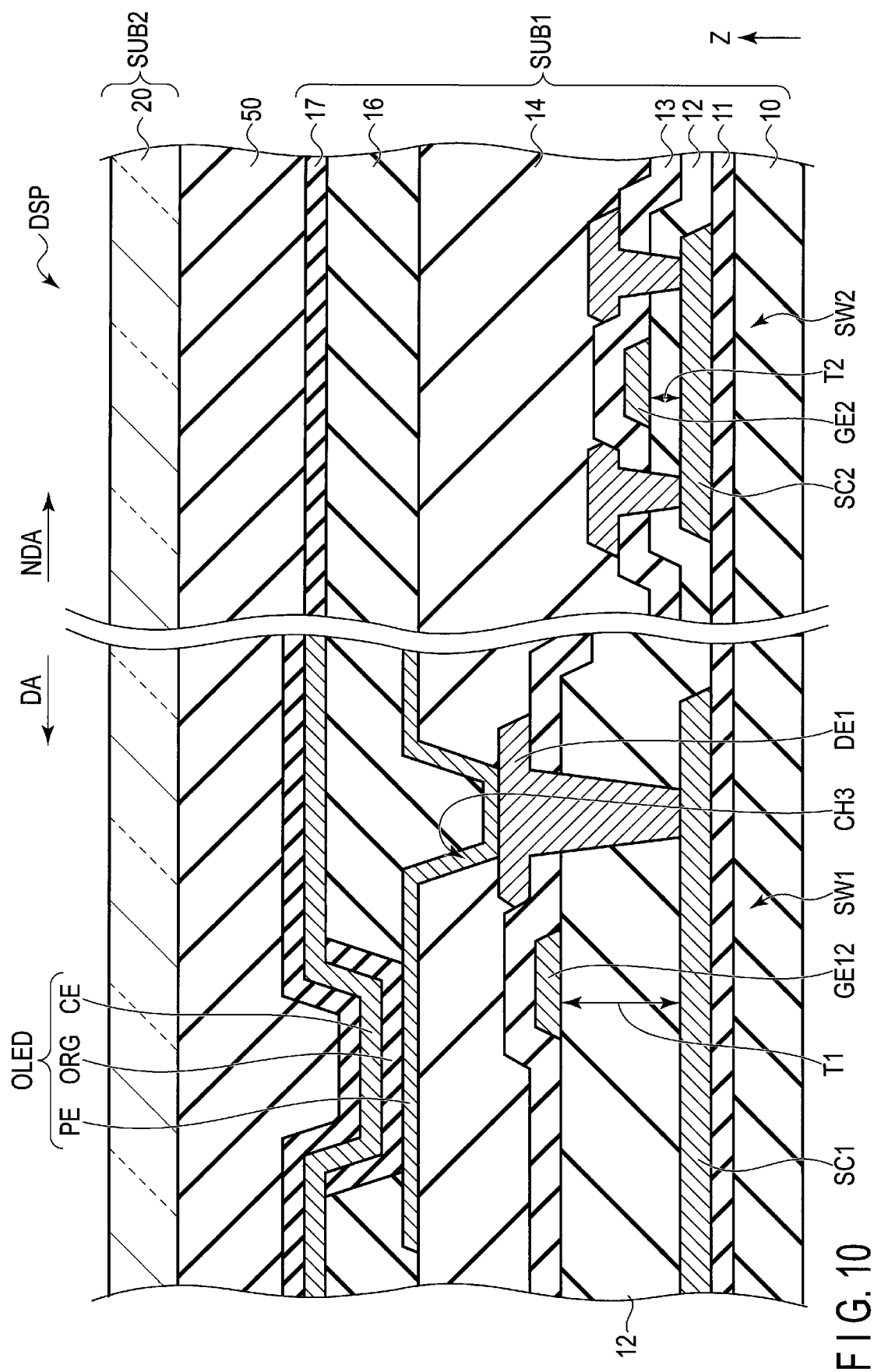
FIG. 10 is a sectional view showing another example of the display device.

FIG. 10 is a sectional view showing another example of the display device DSP. The example shown in FIG. 10 differs from the examples shown in FIGS. 3 and 4 in that the display device DSP is an organic electroluminescent (EL) display device including an organic EL element OLED. The illustrated display device DSP is a top emission type organic EL display device.

The first substrate SUB1 includes insulating films 16 and 17 and the organic EL element OLED in addition to the basement 10, the insulating films 11 to 14, the switching element SW1 and the switching element SW2. The structure from the insulating film 11 to the insulating film 14 is the same as those of the examples shown in FIGS. 3 and 4, and therefore explanation thereof will be omitted.

The organic EL element OLED is composed of the pixel electrode PE, the common electrode CE and an organic light emitting layer ORG. The pixel electrode PE is located on the insulating film 14. The pixel electrode PE functions, for example, as the anode of the organic EL element OLED. The pixel electrode PE contacts the drain electrode DE1 of the switching element SW1 via the contact hole CH3 provided in the insulating film 14. The organic light emitting layer ORG is formed on the pixel electrode PE. The organic light emitting layer ORG may further include an electron-injection layer, a hole-injection layer, an electron-transport layer, a hole-transport layer, etc., to improve light emitting efficiency. The common electrode CE is formed on the organic light emitting layer ORG. The common electrode CE functions, for example, as the cathode of the organic EL element OLED.

Each organic EL element OLED is partitioned with the insulating film (rib) 16 formed of an organic insulating material. The organic light emitting layer ORG contacts the pixel electrode PE between the insulating film 16 and the insulating film 16. In the example illustrated, the insulating film 16 extends to the non-display area NDA. The insulating film 17 covers the organic EL element OLED, and also covers the insulating film 16 in the non-display area NDA. The insulating film 17 is formed of a transparent inorganic insulating material, for example, and functions as a sealing film which protects the organic EL element OLED from moisture, etc.

The organic EL element OLED structured as described above emits light at luminous intensity corresponding to voltage (or current) applied between the pixel electrode PE and the common electrode CE. Although not shown in the drawing, in the case of a top emission type such as the present example, the organic EL element OLED should preferably include a reflective layer between the insulating film 14 and the pixel electrode PE, for example. The reflective layer is formed of, for example, a highly reflective metal material such as aluminum or silver.

In the example illustrated, the first substrate SUB1 and the second substrate SUB2 are attached together by a transparent adhesive 50. The basement 20 here corresponds to the second substrate SUB2, but the second substrate SUB2 may include a color filter layer.

Since the thickness T1 is greater than the thickness T2 in the present example, the same effect as that produced from the example shown in FIG. 4 can also be produced from the present example.

As described above, according to the present embodiment, a highly reliable display device can be provided.

In the first embodiment, the switching element SW1 corresponds to the first switching element, the semiconductor layer SC1 corresponds to the first semiconductor layer, the gate electrode GE12 corresponds to the first gate electrode, and the drain electrode DE1 corresponds to the relay electrode. The switching element SW2 corresponds to the second switching element, the semiconductor layer SC2 corresponds to the second semiconductor layer, and the gate electrode GE2 corresponds to the second gate electrode. The insulating film 12 corresponds to the insulating film. The thickness T1 corresponds to the first thickness, the thickness T2 corresponds to the second thickness, and the thickness T3 corresponds to the third thickness.

Second Embodiment

Figure 11:
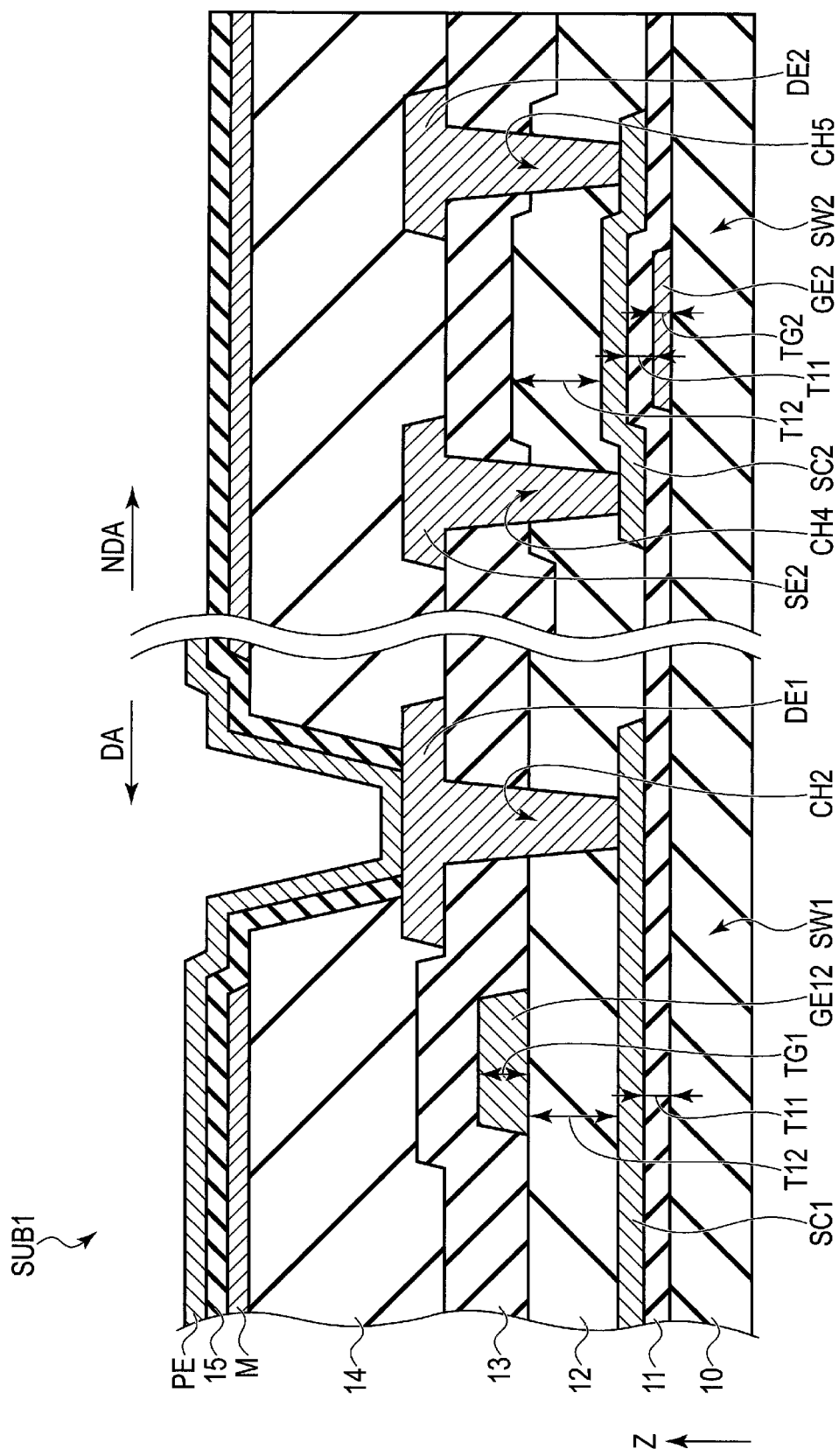
FIG. 11 is a sectional view of a first substrate of a display device according to the second embodiment.

FIG. 11 is a sectional view of the first substrate SUB1 of the display device DSP according to the second embodiment. FIG. 11 shows part of the switching element SW1 arranged in the display area DA and the switching element SW2 arranged in the non-display area NDA. The switching element SW1 have the same structure as that of the switching element SW1 shown in FIG. 3 and is electrically connected to the pixel electrode PE. The switching element SW2 is, for example, a switching element included in the source driver SD, the gate drivers GD1 and GD2, etc.

In the present embodiment, the switching element SW1 is a top-gate thin-film transistor. On the other hand, the switching element SW2 is a bottom-gate thin-film transistor. The switching element SW2 has a single-gate structure in the example illustrated but may have a double-gate structure.

The switching element SW2 includes the semiconductor layer SC2, the gate electrode GE2, the source electrode SE2 and the drain electrode DE2. The gate electrode GE2 is located on the basement 10 and is covered with the insulating film 11. The semiconductor layer SC2 is located on the insulating film 11 and is covered with the insulating film 12. The semiconductor layer SC2 is formed of polycrystalline silicon, for example, but may be formed of amorphous silicon or an oxide semiconductor. The source electrode SE2 and the drain electrode DE2 are located on the insulating film 13 and are covered with the insulating film 14. The source electrode SE2 and the drain electrode DE2 contact the semiconductor layer SC, respectively, via the contact holes CH4 and CH5 which penetrate the insulating films 13 and 12.

In the above-described structure, the insulating film 11 functions as the gate insulating film of the switching element SW2, and the insulating film 12 functions as the gate insulating film of the switching element SW1. In other words, the semiconductor layers SC1 and SC2 are located between the insulating film 11 and the insulating film 12, and the gate electrode GE12 and the gate electrode GE2 are located on the opposite sides to each other with the insulating films 11 and 12 sandwiched between the gate electrode GE12 and the gate electrode GE2.

The insulating film 11 has a substantially constant thickness T11 entirely across the display area DA and the non-display area NDA. The insulating film 12 has a substantially constant thickness T12 entirely across the display area DA and the non-display area NDA. In the present embodiment, the gate insulating film of the switching element SW1 is thicker than the gate insulating film of the switching element SW2. That is, the thickness T12 is greater than the thickness T11. Therefore, the distance between the semiconductor layer SC1 and the gate electrode GE12 is greater than the distance between the semiconductor layer SC2 and the gate electrode GE12 in the second embodiment as is the case with the first embodiment. For example, the thickness T12 is greater than or equal to three times as thick as the thickness T11 and less than or equal to five times as thick as the thickness T11. More specifically, the thickness T12 is 200 to 300 nm, for example, and the thickness T11 is 50 to 100 nm, for example.

Further, a thickness TG1 of the gate electrode GE12 is greater than a thickness TG2 of the gate electrode GE2. For example, the thickness TG1 is greater than or equal to twice the thickness TG2 and less than or equal to fifteen times as thick as the thickness TG2. More specifically, the thickness TG1 is 200 to 500 nm, for example, and the thickness TG2 is 30 to 100 nm, for example.

According to the present embodiment, the display device DSP includes both a top-gate type switching element and a bottom-gate type switching element. That is, the insulating film 11 and the gate electrode GE2 are located the lower side and the insulating film 12 and the gate electrode GE12 are located on the upper side with the active layers (the semiconductor layers SC1 and SC2) sandwiched therebetween. In this structure, the insulating film 12 corresponds to the gate insulating film of the switching element SW1, and the insulating film 11 corresponds to the gate insulating film of the switching element SW2. Since the thickness T11 of the insulating film 11 and the thickness T12 of the insulating film 12 can be set independently from each other, the thickness T12 of the gate insulating film of the switching element SW1 can be greater than the thickness T11 of the gate insulating film of the switching element SW2. As a result, even if the drive voltage of the switching element SW1 arranged in the pixel PX (that is, the voltage applied to the gate electrodes GE11 and GE12) is higher than the drive voltage of the switching element SW2 included in the peripheral circuit (that is, the voltage applied to the gate electrode GE2), dielectric breakdown of the insulating film 11 in the switching element SW1 and dielectric breakdown of the insulating film 12 in the switching element SW1 can be prevented. Therefore, a highly-reliable display device can be provided.

Meanwhile, in a transistor constituting a switching element, as the thickness of a gate insulating film increases, the effect of preventing dielectric breakdown will increase but on current will decrease. In particular, high drive performance is required of a switching element constituting a peripheral circuit, and therefore a decrease of on current leads to an increase of the size of a switching element and makes it difficult to realize a highly-integrated peripheral circuit. This may inhibit narrowing down of the frame of the non-display area NDA in which peripheral circuits are arranged.

According to the present embodiment, the thickness T11 of the gate insulating film of the switching element SW2 can be set independently from the thickness T12 of the gate insulating film of the switching element SW1. Therefore, as the thickness T11 of the gate insulating film is set to a desired thickness, desired performance can be realized without causing an increase of the size of the switching element SW2. Therefore, the frame can be narrowed.

Further, according to the present embodiment, the gate electrode GE12 and the gate electrode GE2 are arranged in different layers via the active layers, the thickness TG2 of the gate electrode GE2 and the thickness TG1 of the gate electrode GE12 can be set independently. Therefore, in the top-gate type switching element SW1, the resistance of the gate electrode GE12 can be reduced by increasing the thickness TG1 of the gate electrode GE12. On the other hand, in the bottom-gate type switching element SW2, if the semiconductor layer SC2 is formed of polycrystalline silicon, for example, amorphous silicon is polycrystallized by applying laser light to amorphous silicon. In polycrystallization, if the gate electrode GE2 is thick, polycrystallization of amorphous silicon may be prevented by heat dissipation via the gate electrode GE2. According to the present embodiment, amorphous silicon can be stably crystallized by setting the thickness TG2 to a desired thickness independently from the thickness TG1.

Figure 12:
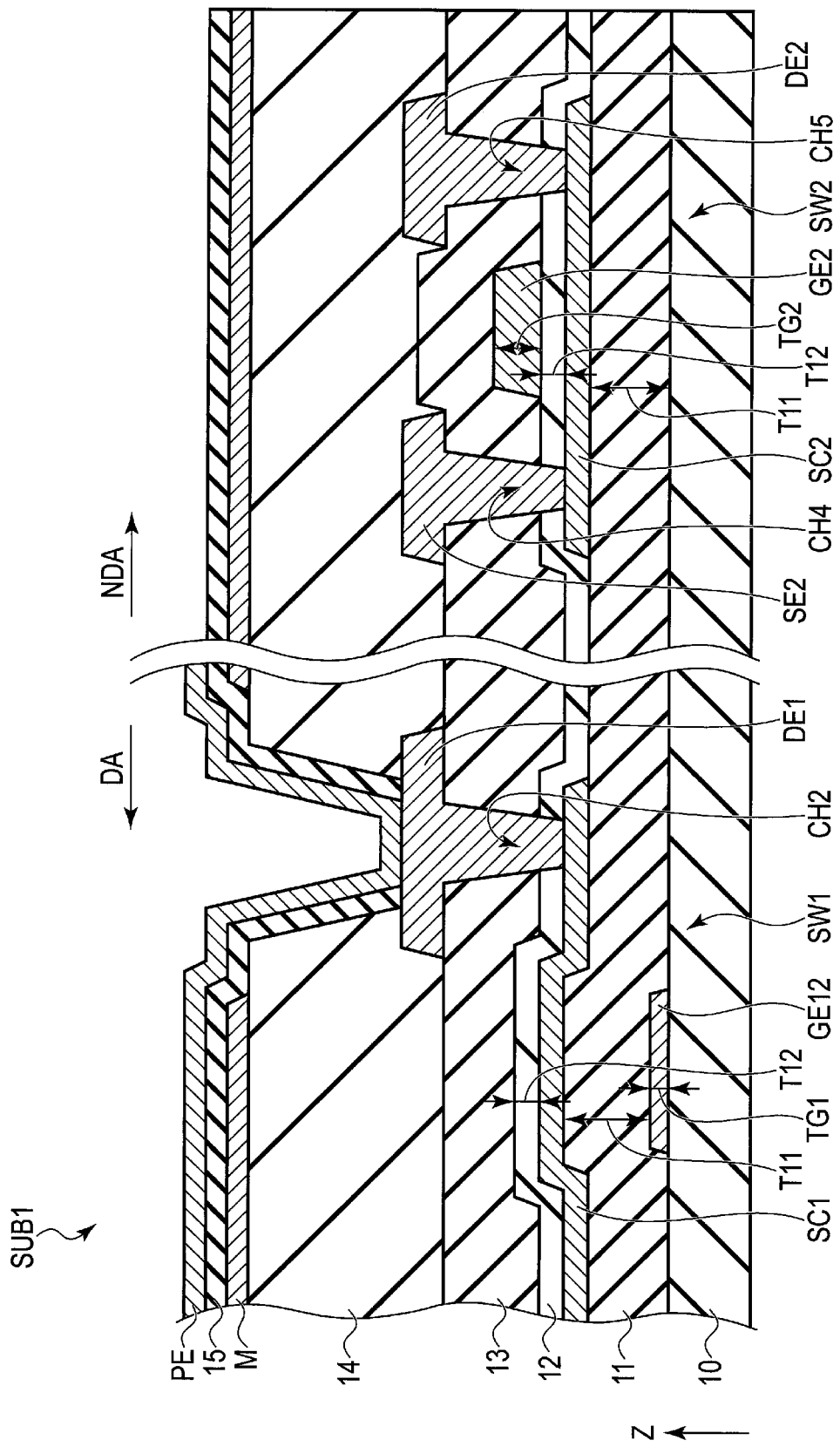
FIG. 12 is a sectional view showing another example of the first substrate.

FIG. 12 is a sectional view showing another example of the first substrate SUB1. The example shown in FIG. 12 differs from the example shown in FIG. 11 in that the switching element SW1 is a bottom-gate type and the switching element SW2 is a top-gate type. That is, the gate electrode GE12 is located between the basement 10 and the insulating film 11. The gate electrode GE2 is located on the insulating film 12.

In the present example, the insulating film 11 corresponds to the gate insulating film of the switching element SW1, and the insulating film 12 corresponds to the gate insulating film of the switching element SW2. In the present example also, the thickness of the gate insulating film of the switching element SW1 is greater than the thickness of the gate insulating film of the switching element SW2. That is, the thickness T11 is greater than the thickness T12. For example, the thickness T11 is greater than or equal to three times as thick as the thickness T12 and less than or equal to five times as thick as the thickness T12. More specifically, the thickness T11 is 200 to 300 nm, for example, and the thickness T12 is 50 to 100 nm, for example.

Further, the thickness TG2 of the gate electrode GE2 is greater than the thickness TG1 of the gate electrode GE12. For example, the thickness TG2 is greater than or equal to twice the thickness TG1 and less than or equal to fifteen times as thick as the thickness TG1. More specifically, the thickness TG1 is 30 to 100 nm, for example, and the thickness TG2 is 200 to 500 nm, for example.

Since the thickness T11 of the insulating film 11 and the thickness T12 of the insulating film 12 can be set independently in the present example, the same effect as that produced from the example shown in FIG. 11 can also be produced from the present example.

Figure 13:
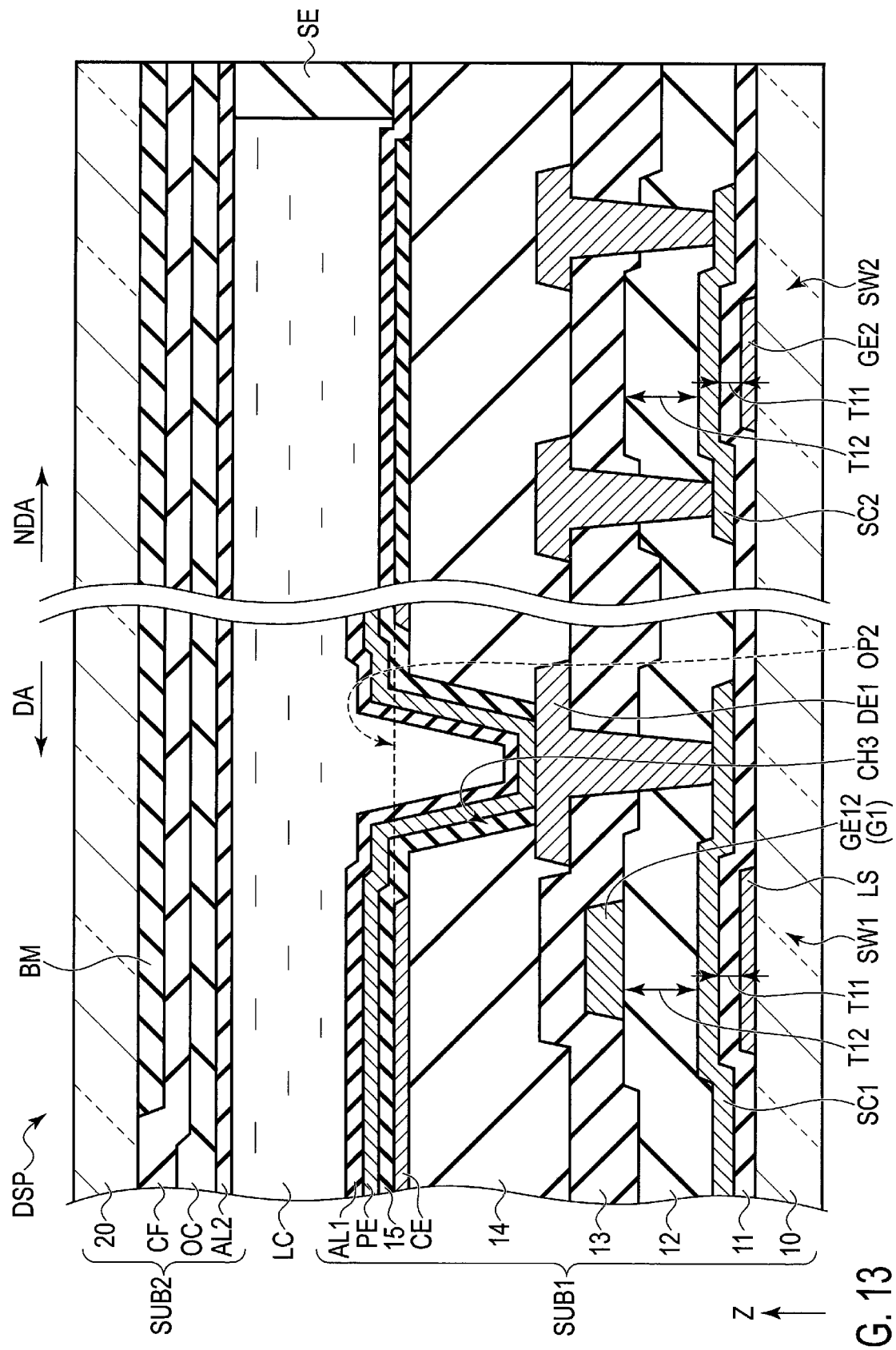
FIG. 13 is a sectional view showing another example of the display device.

FIG. 13 is a sectional view showing another example of the display device DSP. The example shown in FIG. 13 differs from the example shown in FIG. 11 in that the display device DSP is a liquid crystal display device including the liquid crystal layer LC. The first substrate SUB1 and the second substrate SUB2 are attached together by the sealant SE. The liquid crystal layer LC is held between the first substrate SUB1 and the second substrate SUB2.

The first substrate SUB1 includes the light-shielding layer LS, the common electrode CE and the alignment film AL1 in addition to the basement 10, the insulating films 11 to 15, the switching element SW1, the switching element SW2 and the pixel electrode PE. The structure from the insulating film 11 to the insulating film 14 is the same as that of the example shown in FIG. 11. Further, the structure from the common electrode CE to the alignment film AL1 and the structure of the second substrate SUB2 are the same as those of the first embodiment.

Since the thickness T11 of the insulating film 11 and the thickness T12 of the insulating film 12 can be set independently in the present example, the same effect as that produced from the example shown in FIG. 11 can also be produced from the present example.

Figure 14:
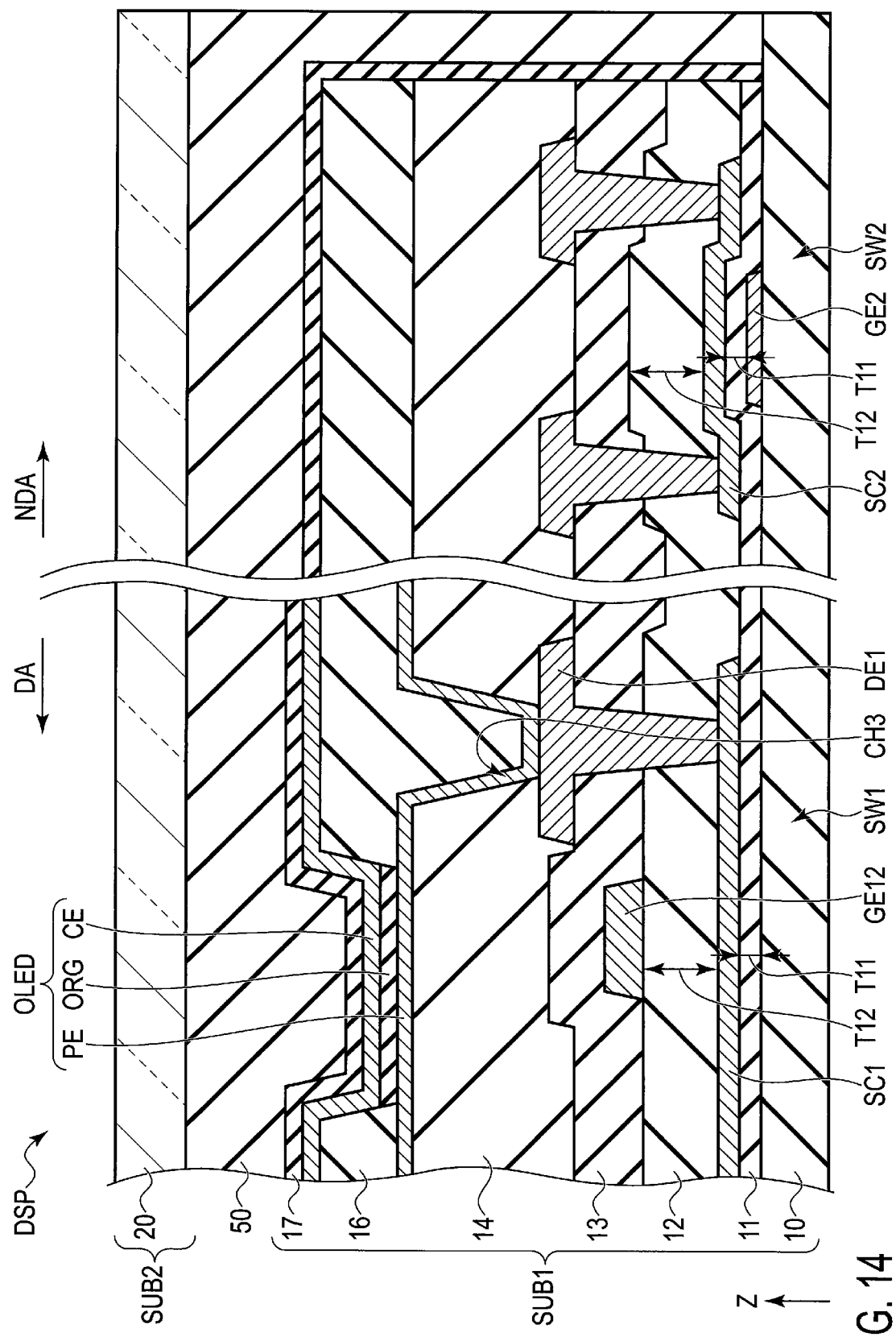
FIG. 14 is a sectional view showing another example of the display device.

FIG. 14 is a sectional view showing another example of the display device DSP. The example shown in FIG. 14 differs from the example shown in FIG. 11 in that the display device DSP is an organic electroluminescent (EL) display device including the organic EL element OLED. The illustrated display device DSP is a top emission type organic EL display device.

The first substrate SUB1 includes the insulating films 16 and 17 and the organic EL element OLED in addition to the basement 10, the insulating films 11 to 14, the switching element SW1 and the switching element SW2. The structure from the insulating film 11 to the insulating film 14 is the same as that of the example shown in FIG. 11. Further, the structure of the organic EL element OLED and the structure of the second substrate SUB2 are the same as those of the first embodiment.

In the first substrate SUB1, the insulating film 17 covers the organic EL element OLED, and also covers the insulating film 16 in the non-display area NDA. In the example illustrated, the insulating film 17 extends to a position above the switching element SW2 and contacts the insulating films 14, 13, 12 and 11. In the example illustrated, the insulating film 17 also contacts the basement 10. The insulating film 17 is formed of a transparent inorganic insulating material, for example, and functions as a sealing film which protects the organic EL element OLED from moisture, etc. According to the above-described structure, as the insulating films 16 and 14 formed of an organic insulating material are sealed with the insulating films 17 and 13 formed of an inorganic insulating material, the entry of moisture to the insulating films 16 and 14 will be prevented.

Since the thickness T11 of the insulating film 11 and the thickness T12 of the insulating film 12 can be set independently in the present example, the same effect as that produced from the example shown in FIG. 11 can also be produced from the present example.

As described above, according to the present embodiment, a highly reliable display device can be provided.

In the second embodiment, the switching element SW1 corresponds to the first switching element, the semiconductor layer SC1 corresponds to the first semiconductor layer, and the gate electrode GE12 corresponds to the first gate electrode. The switching element SW2 corresponds to the second switching element, the semiconductor layer SC2 corresponds to the second semiconductor layer, and the gate electrode GE2 corresponds to the second gate electrode. The insulating film 11 corresponds to the first insulating film, and the thickness T11 corresponds to the fourth thickness. The insulating film 12 corresponds to the second insulating film, and the thickness T12 corresponds to the fifth thickness.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a basement;
a first switching element which is provided on the basement and includes a first semiconductor layer and a first gate electrode;
a second switching element which is provided on the basement and includes a second semiconductor layer and a second gate electrode;
an insulating film which has a first thickness between the first semiconductor layer and the first gate electrode and has a second thickness between the second semiconductor layer and the second gate electrode; and
a pixel electrode which is electrically connected to the first switching element, wherein
the first thickness is greater than the second thickness,
a distance between the first semiconductor layer and the first gate electrode is greater than a distance between the second semiconductor layer and the second gate electrode,
the first semiconductor layer has a first area which overlaps the first gate electrode and a second area which does not overlap the first gate electrode, and
the insulating film has the first thickness in the first area and has a third thickness which is less than the first thickness in the second area.

2. The display device of claim 1, wherein the third thickness is equal to the second thickness.

3. The display device of claim 1, further comprising a relay electrode which electrically connects the pixel electrode and the first semiconductor layer, wherein
the relay electrode contacts the first semiconductor layer in a contact hole which is provided in the insulating film in the second area.

4. The display device of claim 1, wherein
the second semiconductor layer has a third area which overlaps the second gate electrode and a fourth area which does not overlap the second gate electrode, and
the insulating film has the second thickness in the third area and the fourth area.

5. The display device of claim 1, wherein the first thickness is greater than or equal to three times as thick as the second thickness.

6. A display device comprising:
a basement;
a first switching element which is provided on the basement and includes a first semiconductor layer and a first gate electrode;
a second switching element which is provided on the basement and includes a second semiconductor layer and a second gate electrode;
an insulating film which has a first thickness between the first semiconductor layer and the first gate electrode and has a second thickness between the second semiconductor layer and the second gate electrode; and
a pixel electrode which is electrically connected to the first switching element, wherein
the first thickness is greater than the second thickness,
a distance between the first semiconductor layer and the first gate electrode is greater than a distance between the second semiconductor layer and the second gate electrode,
the insulating film includes a silicon oxide layer and a silicon nitride layer,
the silicon oxide layer contacts the second gate electrode, the first semiconductor layer and the second semiconductor layer, and
the silicon nitride layer is located between the silicon oxide layer and the first gate electrode.

7. The display device of claim 6, wherein
the first semiconductor layer has a first area which overlaps the first gate electrode and a second area which does not overlap the first gate electrode, and
the insulating film has the first thickness in the first area and has a third thickness which is less than the first thickness in the second area.

8. The display device of claim 6, wherein the third thickness is equal to the second thickness.

9. The display device of claim 6, further comprising a relay electrode which electrically connects the pixel electrode and the first semiconductor layer, wherein
the relay electrode contacts the first semiconductor layer in a contact hole which is provided in the insulating film in the second area.

10. The display device of claim 6, wherein
the second semiconductor layer has a third area which overlaps the second gate electrode and a fourth area which does not overlap the second gate electrode, and
the insulating film has the second thickness in the third area and the fourth area.

11. The display device of claim 6, wherein the first thickness is greater than or equal to three times as thick as the second thickness.

12. A display device comprising:
a basement;
a first switching element which is provided on the basement and includes a first semiconductor layer and a first gate electrode;
a second switching element which is provided on the basement and includes a second semiconductor layer and a second gate electrode;
a pixel electrode which is electrically connected to the first switching element;
a first insulating film located on the basement; and
a second insulating film located on the first insulating film, wherein
a distance between the first semiconductor layer and the first gate electrode is greater than a distance between the second semiconductor layer and the second gate electrode,
the first semiconductor layer and the second semiconductor layer are located between the first insulating film and the second insulating film,
the first gate electrode and the second gate electrode are located on opposite sides to each other with the first insulating film and the second insulating film sandwiched between the first gate electrode and the second gate electrode,
the first gate electrode is located between the basement and the first insulating film,
the second gate electrode is located on the second insulating film, and
a fourth thickness of the first insulating film is greater than a fifth thickness of the second insulating film.

13. The display device of claim 12, wherein
the first gate electrode is located on the second insulating film,
the second gate electrode is located between the basement and the first insulating film,
a fourth thickness of the first insulating film is less than a fifth thickness of the second insulating film.

14. The display device of claim 13, wherein a thickness of the first gate electrode is greater than a thickness of the second gate electrode.

15. The display device of claim 13, wherein the fifth thickness is greater than or equal to three times as thick as the fourth thickness.

16. The display device of claim 12, wherein a thickness of the first gate electrode is less than a thickness of the second gate electrode.

17. The display device of claim 12, wherein the fourth thickness is greater than or equal to three times as thick as the fifth thickness.

18. The display device of claim 12, further comprising:
a common electrode opposed to the pixel electrode; and
an electrophoretic element held between the common electrode and the pixel electrode.

* * * * *